(12) United States Patent
Lin et al.

(10) Patent No.: US 8,274,124 B2
(45) Date of Patent: Sep. 25, 2012

(54) BACKSIDE ILLUMINATED IMAGE SENSOR

(75) Inventors: Chia-Huei Lin, Hsinchu (TW);
Kuo-Yuh Yang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 209 days.

(21) Appl. No.: 12/831,417

(22) Filed: Jul. 7, 2010

(65) Prior Publication Data
US 2012/0007198 A1    Jan. 12, 2012

(51) Int. Cl.
*H01L 31/0232* (2006.01)

(52) U.S. Cl. . 257/432; 257/228; 257/774; 257/E31.127; 257/E23.174

(58) Field of Classification Search .................. 257/432, 257/228, 774, E31, 127, E23.174
See application file for complete search history.

(56) References Cited

U.S. PATENT DOCUMENTS

| 6,204,107 | B1 * | 3/2001 | Lin et al. | 438/238 |
|---|---|---|---|---|
| 7,589,008 | B2 | 9/2009 | Kirby | |
| 2006/0138498 | A1 * | 6/2006 | Kim | 257/294 |
| 2007/0238034 | A1 * | 10/2007 | Holscher, Jr. | 430/7 |
| 2009/0020842 | A1 * | 1/2009 | Shiau et al. | 257/459 |
| 2009/0302406 | A1 * | 12/2009 | Gambino et al. | 257/432 |
| 2010/0244173 | A1 * | 9/2010 | Wang et al. | 257/435 |

* cited by examiner

*Primary Examiner* — Tu-Tu Ho
(74) *Attorney, Agent, or Firm* — Ding Yu Tan

(57) ABSTRACT

A backside illuminated (BSI) image sensor including a substrate, a plurality of photosensitive regions, a back-end-of-line (BEOL), a pad, a color filter array, a plurality of micro-lenses and a protection layer is provided. The substrate has a first surface and a second surface. The substrate has a pad opening therein through the first surface and the second surface. The photosensitive regions are disposed in the substrate. The BEOL is disposed on the first surface of the substrate. The pad is disposed in the BEOL and exposed by the pad opening. The color filter array is disposed on the second surface of the substrate. The micro-lenses are disposed on the color filter array. The protection layer at least covers the top corner and the sidewall of the pad opening.

19 Claims, 11 Drawing Sheets

BACKSIDE ILLUMINATED IMAGE SENSOR

BACKGROUND OF THE INVENTION

1. Field of Invention

The present invention relates to an image sensor, and more generally to a backside illuminated (BSI) image sensor.

2. Description of Related Art

The process of forming a complementary metal oxide semiconductor image sensor (CMOS image sensor, CIS) is compatible with the process of forming a complementary metal oxide semiconductor (CMOS) transistor. Therefore, CMOS image sensors and CMOS transistors can be easily integrated with other peripheral circuits on a single chip to significantly lower the power consumption and the manufacturing cost of image sensors. In recent years, CMOS image sensors have replaced charge-coupled devices (CCD) in the low-end applications and are becoming more and more predominant.

In a typical CMOS image sensor, photosensitive regions are disposed in a substrate, and a back-end-of-line (BEOL), a color filter array and micro-lenses are disposed on the same side of the substrate. Therefore, light passes not only the micro-lenses and the color filter but also the BEOL to reach the photosensitive regions disposed in the substrate. Since metal of the BEOL is non-transparent and blocks the light, the amount of the light reaching the pixel array is very limited.

A backside illuminated (BSI) image sensor is an image sensor for detecting the amount of light from the backside of a substrate. In the BSI image sensor, a BEOL is disposed on the front side of the substrate, and photosensitive regions, a color filter array and micro-lenses are disposed on the backside of the substrate. The light is illuminated on the backside of the substrate and only passes the micro-lenses and the color filter, without passing the BEOL, to reach the photosensitive regions. Light blocking of the BEOL is accordingly avoided, and thus, the sensitivity of each unit region is higher, the quantum efficiency is higher, the interference and the non-uniformity of photo-response are reduced, and the image quality is significantly improved. Due to the development of the pixel structure, CMOS image sensors can compete with CCD sensors, and the applications thereof are not limited to cell phones and are extended to automobiles, medical equipment and monitor cameras. However, a short circuit frequently occurs when the BSI image sensor is tested and packaged with wire bonding technology. electrical short caused by the probing pin, bond wire or bond ball contacting the substrate around the pad opening during the testing and packaging processes. In addition, the pad is too thin to probing contact open and poor bonding issues.

SUMMARY OF THE INVENTION

The present invention provides a backside illuminated (BSI) image sensor to avoid electrical short between the probing pin and the substrate, bond wire and the substrate, or bond ball and the substrate during the testing and packaging processes.

The present invention provides a BSI image sensor including a substrate, a plurality of photosensitive regions, a back-end-of-line (BEOL), a pad, a color filter array, a plurality of micro-lenses and a protection layer. The substrate has a first surface and a second surface. The substrate has a pad opening therein through the first surface and the second surface. The photosensitive regions are disposed in the substrate. The BEOL is disposed on the first surface of the substrate. The pad is disposed in the BEOL and exposed by the pad opening. The color filter array is disposed on the second surface of the substrate. The micro-lenses are disposed on the color filter array. The protection layer at least covers the top corner and the sidewall of the pad opening.

According to an embodiment of the present invention, the protection layer includes an inorganic dielectric material, an organic material or a combination thereof.

According to an embodiment of the present invention, the inorganic dielectric material includes silicon oxide, silicon nitride, silicon oxynitride or a combination thereof.

According to an embodiment of the present invention, the organic material includes a positive photoresist material, or a negative photoresist material.

According to an embodiment of the present invention, the BSI image sensor further includes an anti-reflection layer disposed between the substrate and the color filter array, wherein the protection layer and the anti-reflection layer include the same material.

According to an embodiment of the present invention, the protection layer and the color filter array include the same material.

According to an embodiment of the present invention, the protection layer and the micro-lenses include the same material.

According to an embodiment of the present invention, the BSI image sensor further includes a cap layer covering the micro-lenses, wherein the protection layer and the cap layer include the same material.

According to an embodiment of the present invention, the protection layer is a single layer.

According to an embodiment of the present invention, the protection layer is a stacked structure.

According to an embodiment of the present invention, the stacked structure includes a first material layer and a second material layer, and at least one of the first material layer and the second material layer covers the top corner and the sidewall of the pad opening.

According to an embodiment of the present invention, the first material layer and the second material layer include different materials.

According to an embodiment of the present invention, the material of the first material layer is the same as that of an inorganic dielectric material layer, an anti-reflection layer, the color filter array or the micro-lenses.

According to an embodiment of the present invention, the material of the second material layer is the same as that of an inorganic dielectric material layer, an anti-reflection layer, the color filter array, the micro-lenses or a cap layer.

According to an embodiment of the present invention, the protection layer includes a first portion and a second portion, the first portion is disposed on the second surface of the substrate, and the second portion is disposed on the sidewall of the pad opening and connected to the first portion.

According to an embodiment of the present invention, the first portion and the second portion include the same material.

According to an embodiment of the present invention, the first portion and the second portion include different materials.

According to an embodiment of the present invention, the protection layer further extends between the substrate and the color filter array.

According to an embodiment of the present invention, the BSI image sensor further comprises a metal shield to cover the pad and the protection layer on a optical black area.

According to an embodiment of the present invention, the BSI image sensor further includes a handle wafer disposed on the first surface of the substrate, wherein the BEOL is disposed between the handle wafer and the substrate.

In view of the above, in the present invention, the protection layer is formed to protect the top corner and the sidewall of the pad opening, so as to avoid electrical short caused by the probing pin, bond wire, or bond ball contacting the substrate around the pad opening during the testing and packaging processes.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
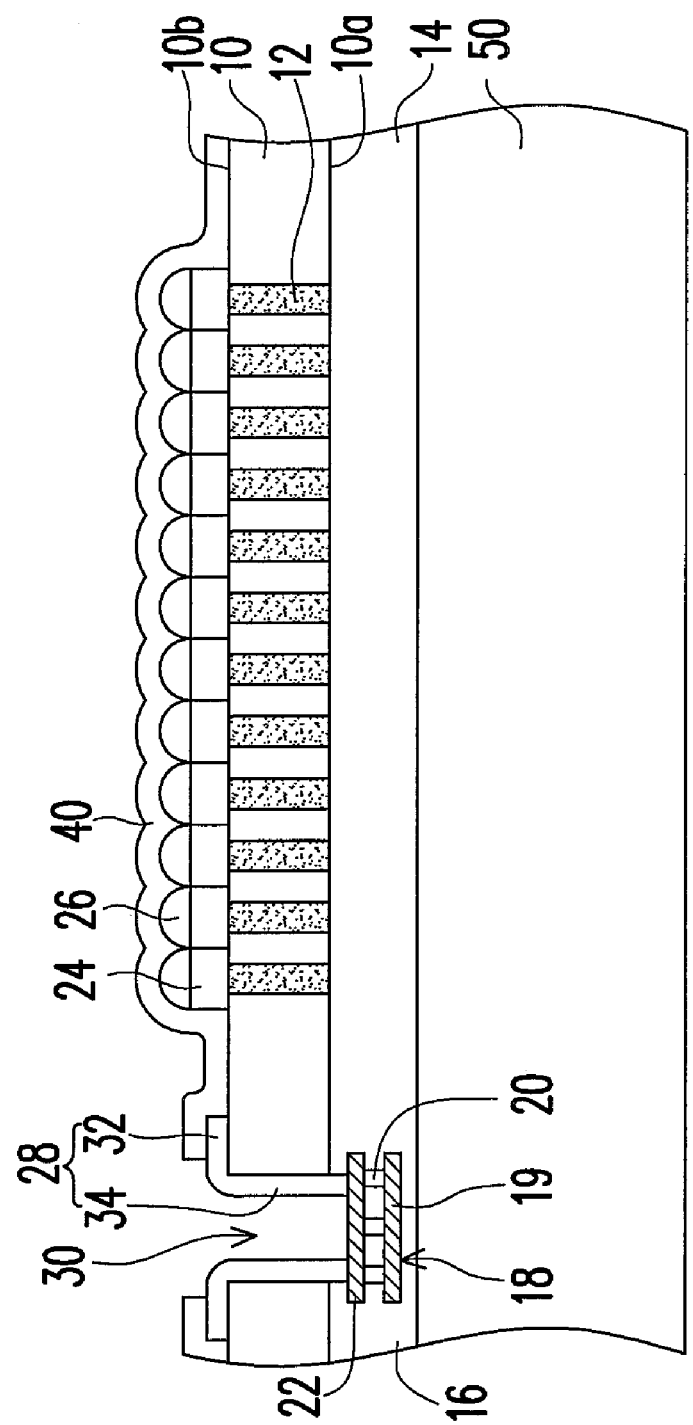
FIGS. 1 to 9 each schematically illustrate a cross-sectional view of a backside illuminated (BSI) image sensor according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 schematically illustrates a cross-sectional view of a backside illuminated (BSI) image sensor according to an embodiment of the present invention.

Referring to FIG. 1, the BSI image sensor includes a substrate 10, a plurality of photosensitive regions 12, a back-end-of-line (BEOL) 14, a pad 22, a color filter array 24, a plurality of micro-lenses 26, a protection layer 28 and a cap layer 40.

The substrate 10 has a first surface 10a and a second surface 10b. The thickness of the substrate 10 is about 1 um to about 10 um, which is less than that of a common semiconductor wafer. The substrate 10 has a pad opening therein through the first surface 10a and the second surface 10b. The substrate 10 can be a thinned semiconductor wafer, such as a thinned silicon wafer. The thinning process is usually achieved by performing a polishing process after the BEOL 14 is formed and before the color filter array 24 is formed. Further, after the polishing process is performed, the pad opening 30 can be formed in the substrate 10 through photolithography and etching processes.

The photosensitive regions 12 are disposed in the substrate 10. In an embodiment, the photosensitive regions 12 are diode doped regions, for example. The diode doped regions are disposed in the substrate 10 approximate to the first surface 10a. In an embodiment, the substrate 10 is a P-type substrate, and the diode doped regions are N-type doped regions formed through an ion implantation process, for example.

The BEOL 14 is disposed on the first surface 10a of the substrate 10. The BEOL 14 includes a dielectric layer 16 and a multi-level metal interconnection 18. The material of the dielectric layer 16 is silicon oxide, silica glass, phosphosilicate glass (PSG), borophosphosilicate glass (BPSG), fluorosilicate glass (FSG), undoped silicate glass (USG), low k material or the like, for example. The dielectric layer 16 is formed through a chemical vapour deposition (CVD) process, for example. The multi-level metal interconnection 18 is constituted by a plurality of horizontal metal layers 19 and a plurality of vertical via plugs 20. The material of the metal layers 19 is copper (Cu), aluminium (Al), AlCu alloy or AlSiCu alloy, for example. The material of the via plugs 20 is copper (Cu) or tungsten (W), for example.

The pad 22 is disposed in the BEOL 14 and exposed by the pad opening 30. The pad 22 can be the first metal layer of the multi-level metal interconnection 18 most approximate to the first surface 10a of the substrate 10, or the second metal layer of the multi-level metal interconnection 18 on the first surface 10a of the substrate 10. However, the present invention is not limited thereto.

The substrate 10 is relatively thin, so that a handle wafer 50 is further included below the BEOL 14 for improving the whole structuredness of the BSI image sensor. The handle wafer 50 can be attached to the BEOL 14 after the BEOL is formed and before the polishing (thinning) process is performed to the substrate 10.

The color filter array 24 is disposed on the second surface 10b of the substrate 10. The color filter array 24 substantially corresponds to the photosensitive regions 12. The color filter array 24 includes a red filter unit, a green filter unit, a blue filter unit, a black matrix, or other color filter units, or a combination thereof, for example. The color filter array 24 includes an organic material, such as a negative photoresist material. The method of forming the color filter array 24 includes patterning the color filter material films of required colors after the polishing (thinning) process is performed to the substrate 10.

The micro-lenses 26 are disposed on the color filter array 24. The micro-lenses 26 include an organic material, such as a positive photoresist material. The method of forming the micro-lenses 26 is described below. After the color filter array 24 is formed, a micro-lens material layer is coated on the color filter array 24. Thereafter, a patterning process is preformed. Afterwards, a high temperature thermal baking (about 140° C. to about 210° C.) is performed, so as to cure and form the curved micro-lenses 26.

The protection layer 28 at least covers the top corner and the sidewall of the pad opening 30 and exposes the surface of the pad 22. The material of the protection layer 28 includes an inorganic dielectric material, an organic material or a combination thereof. The inorganic dielectric material includes silicon oxide, silicon nitride, silicon oxynitride, hafnium oxide, magnesium fluoride, tantalum oxide ($Ta_2O_5$) or a combination thereof. The organic material includes a positive photoresist material, or a negative photoresist layer. The thickness of the protection layer 28 is about 100 to about 10,000 angstroms, for example. The protection layer 28 includes a first portion 32 and a second portion 34, wherein the first portion 32 is disposed on the second surface 10b of the substrate 10 approximate to the top corner, and the second portion 34 is disposed on the sidewall of the pad opening 30 and connected to the first portion 32. The material of the first portion 32 can be the same as or different from that of the second portion 34. Each of the first portion 32 and the second portion 34 of the protection layer 28 can be a single layer formed by a single material, or a stacked structure formed by two different materials.

The cap layer 40 covers the micro-lenses 26, the substrate 10 and the protection layer 28. The cap layer 40 includes an insulating material, such as silicon oxide. The cap layer 40 is formed through a CVD process, and the thickness thereof is about 10 nm to about 300 nm, for example.

In the present invention, the BSI image sensor having the protection layer 28 is simply illustrated in FIG. 1. However, the shape and structure of the protection layer 28 is not limited by FIG. 1. Several embodiments are numerated in the following.

Figure 2:
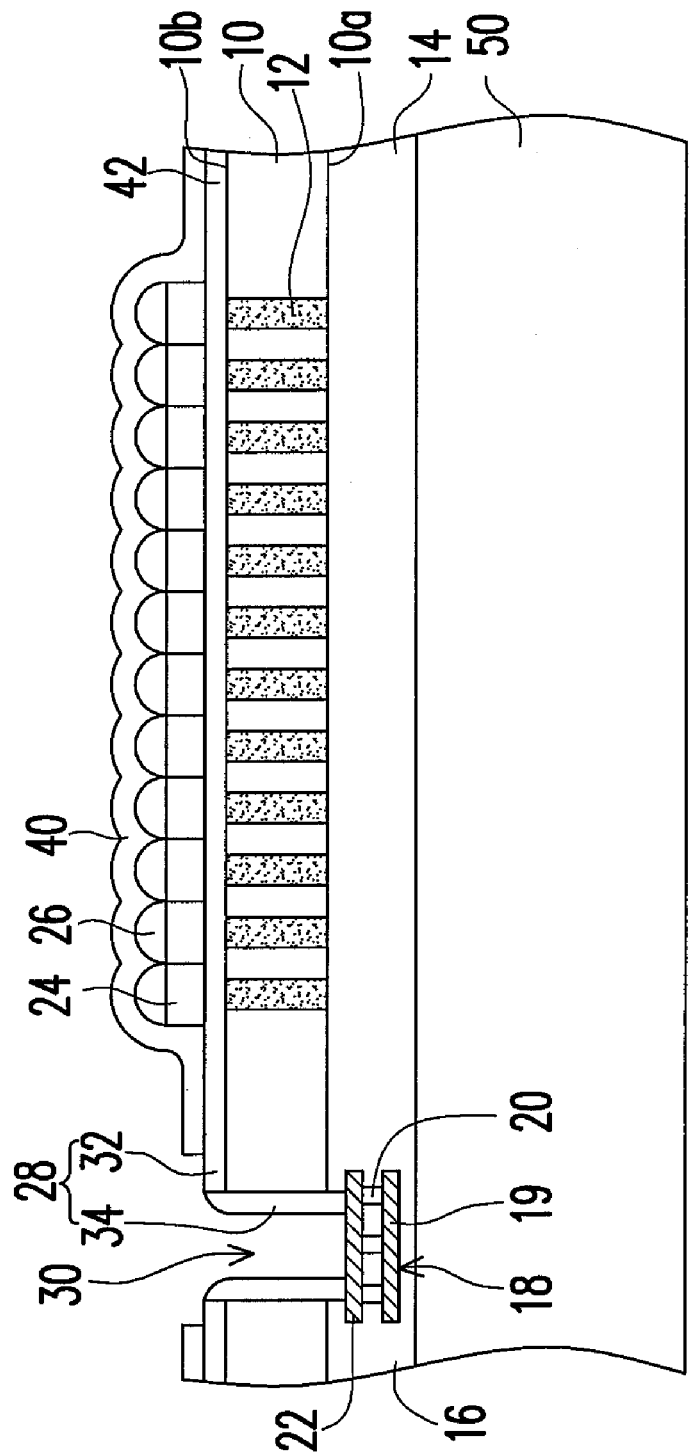

In some embodiments, an anti-reflection layer 42 is further included between the substrate 10 and the color filter array 24. The anti-reflection layer 42 is a layer having the anti-reflection effect to the visible light (the wavelength range is from about 380 nm to about 700 nm). In an embodiment, the refractive index (n) of the anti-reflection layer 42 is between that of the substrate 10 and that of the color filter array 24, so as to enhance the anti-reflection property. In an embodiment, the substrate 10 includes silicon and has an n value of about 3.5, the color filter array 24 has an n value of about 1.6, and the protection layer 28 includes silicon oxynitride or silicon nitride and has an n value of about 1.6 to 3.5. In an embodiment, referring to FIG. 2, the first portion 32 of the protection layer 28 and the anti-reflection layer 42 between the substrate 10 and the color filter array 24 include the same material. The first portion 32 of the protection layer 28 can be connected to or separated from the anti-reflection layer 42 (FIG. 2 only illustrates the case that the first portion 32 of the protection layer 28 is connected to the anti-reflection layer 42). The material of the second portion 34 of the protection layer 28 can be the same as or different from that of the anti-reflection layer 42. In an embodiment, the first portion 32 of the protection layer 28 is the extension of the anti-reflection layer 42. The method of forming the protection layer 28 is described below. An anti-reflection material layer or a dielectric material is formed on the substrate before the pad opening 30 is formed. Thereafter, lithography and etching processes are performed to pattern the anti-reflection material layer and form the pad opening 30 in the substrate 10, and thus, the anti-reflection layer 42 and the first portion 32 of the protection layer 28 remain. Another anti-reflection layer or dielectric material is deposited after the pad opening 30 is formed, and an etching back process is performed to remove the anti-reflection layer or dielectric material on the bottom of the pad opening 30, so as to expose the pad 22 and form the second portion 34 of the protection layer 28.

Figure 3:
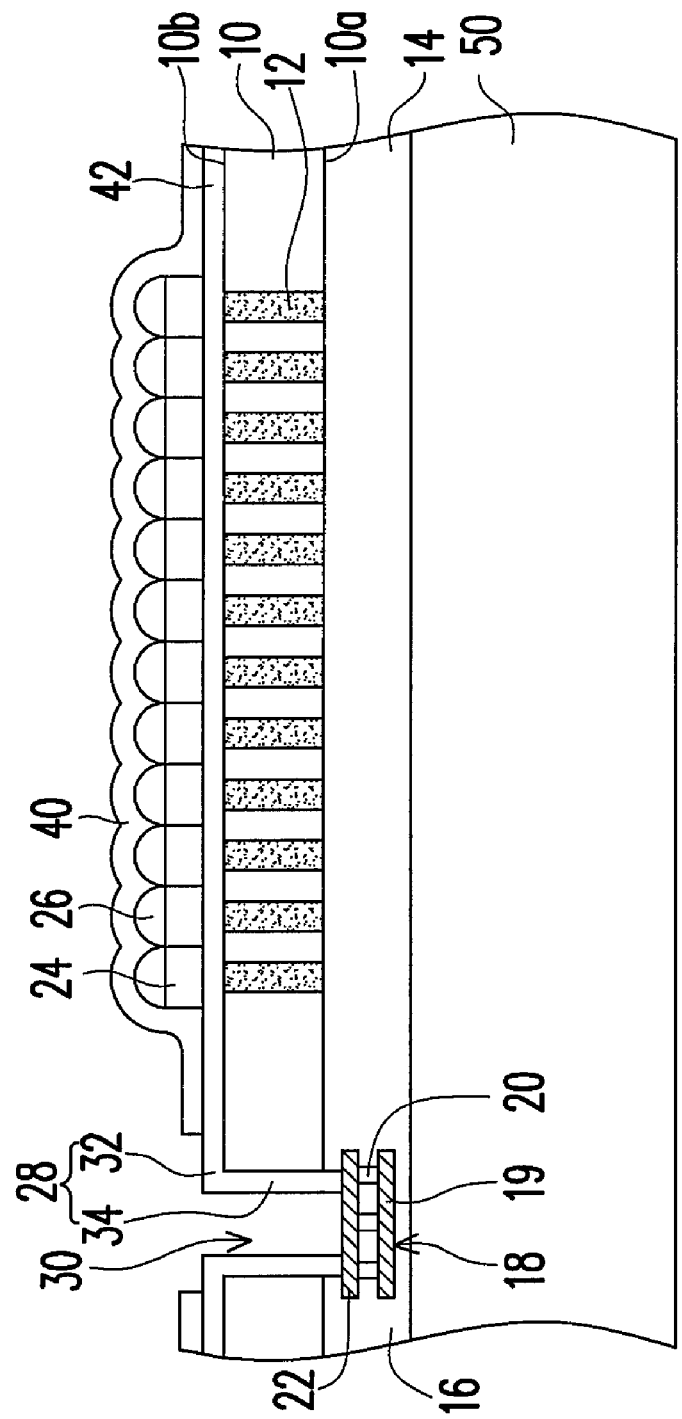

In another embodiment, referring to FIG. 3, the protection layer 28 includes the above-mentioned inorganic dielectric material, covers the top corner and the sidewall of the pad opening 30 and extends between the substrate 10 and the color filter array 24. The method of forming the protection layer 28 is described below. After the pad opening 30 is formed in the substrate, the above-mentioned inorganic dielectric material is formed through a CVD process. Thereafter, photolithography and etching processes are performed, so as to remove the inorganic dielectric material on the bottom of the pad opening 30 to expose the surface of the pad 22. In an embodiment, the protection layer 28 extending between the substrate 10 and the color filter array 24 can serve as an anti-reflection layer.

Figure 4:
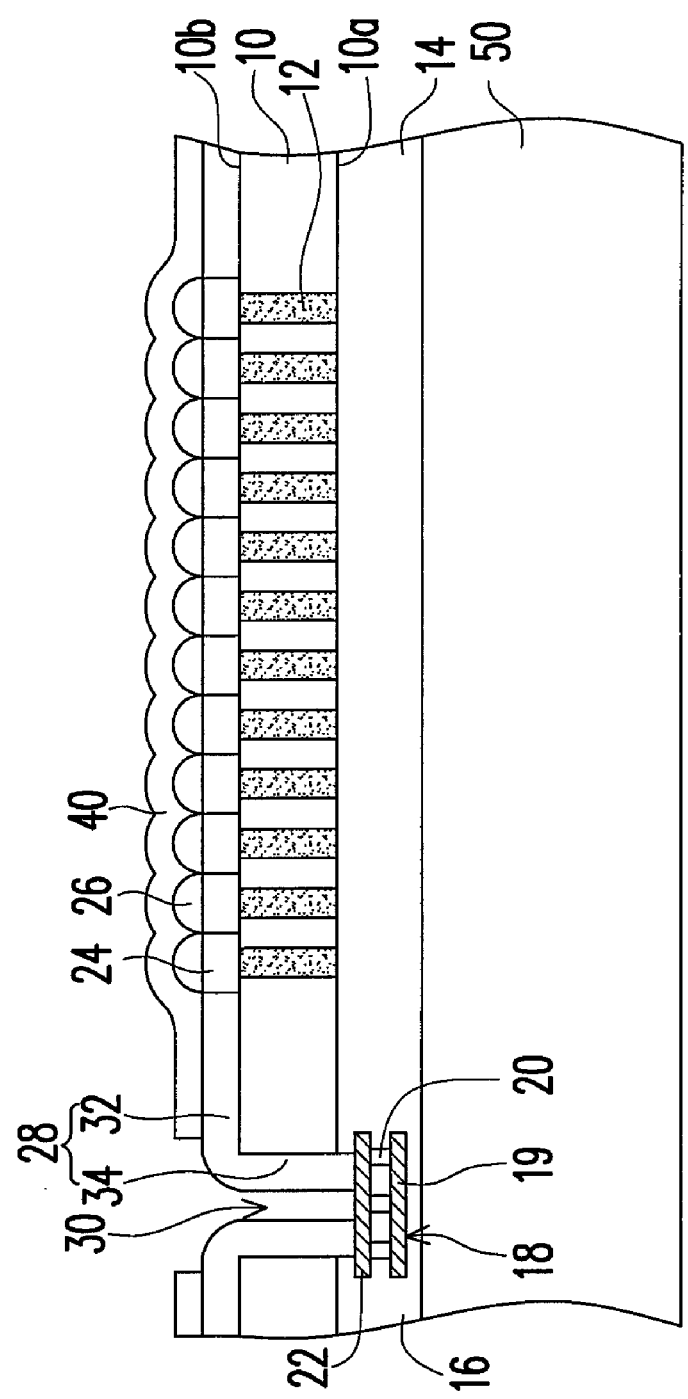

In another embodiment, referring to FIG. 4, the first portion 32 and the second portion 34 of the protection layer 28 and the color filter array 24 include the same material. The method of forming the protection layer 28 is described below. A color filter material layer is formed on the substrate 10. During the patterning process of the color filter material layer, the color filter material layer on the bottom of the pad opening 30 is simultaneously removed to expose the pad 22. Accordingly, the remaining color filter material layer can serve as the color filter array 24 and the protection layer 28.

Figure 5:
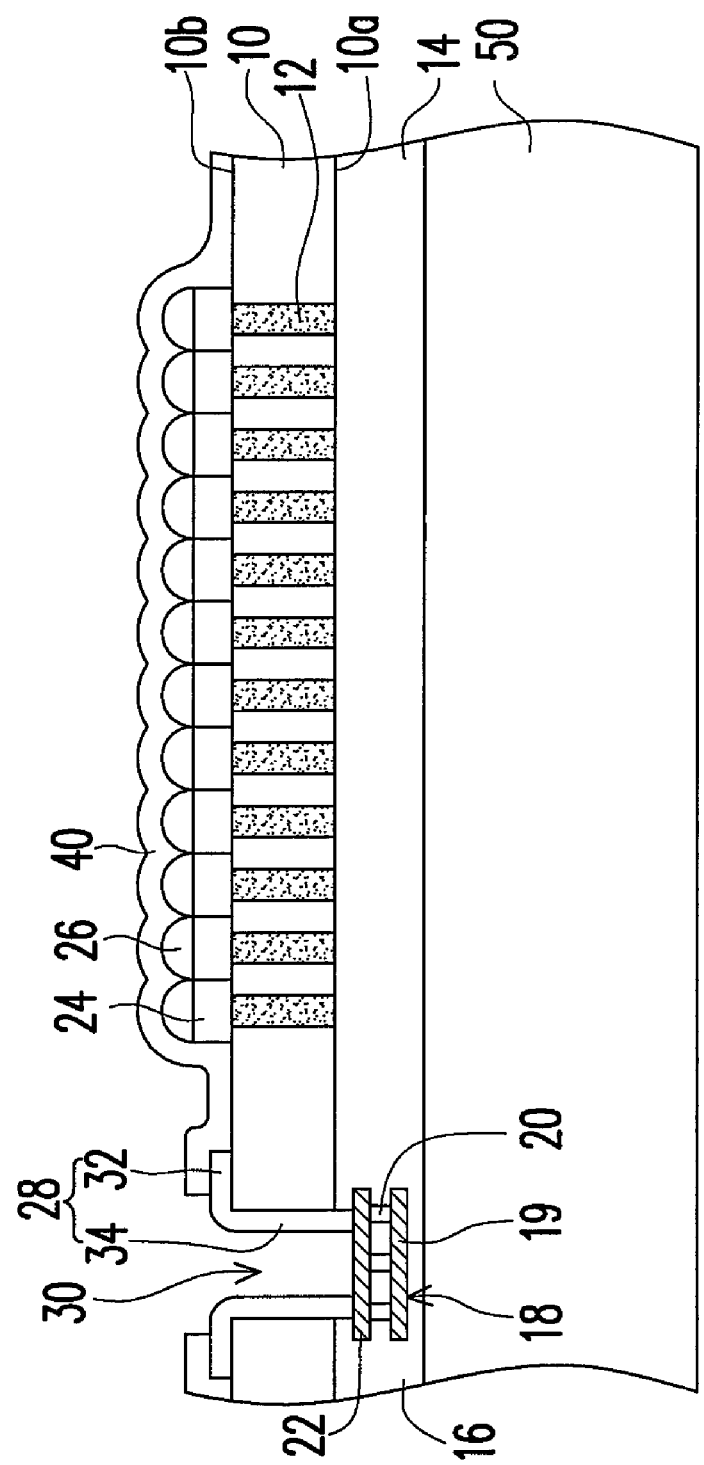

In yet another embodiment, referring to FIG. 5, the first portion 32 and the second portion 34 of the protection layer 28 and the micro-lenses 26 include the same material. The method of forming the protection layer 28 is described below. A micro-lens material layer is formed on the substrate 10. During the patterning process of the micro-lens material layer, the micro-lens material layer on the bottom of the pad opening 30 is simultaneously removed to expose the pad 22. Accordingly, the remaining micro-lens material layer can serve as the micro-lenses 26 and the protection layer 28.

Figure 6:
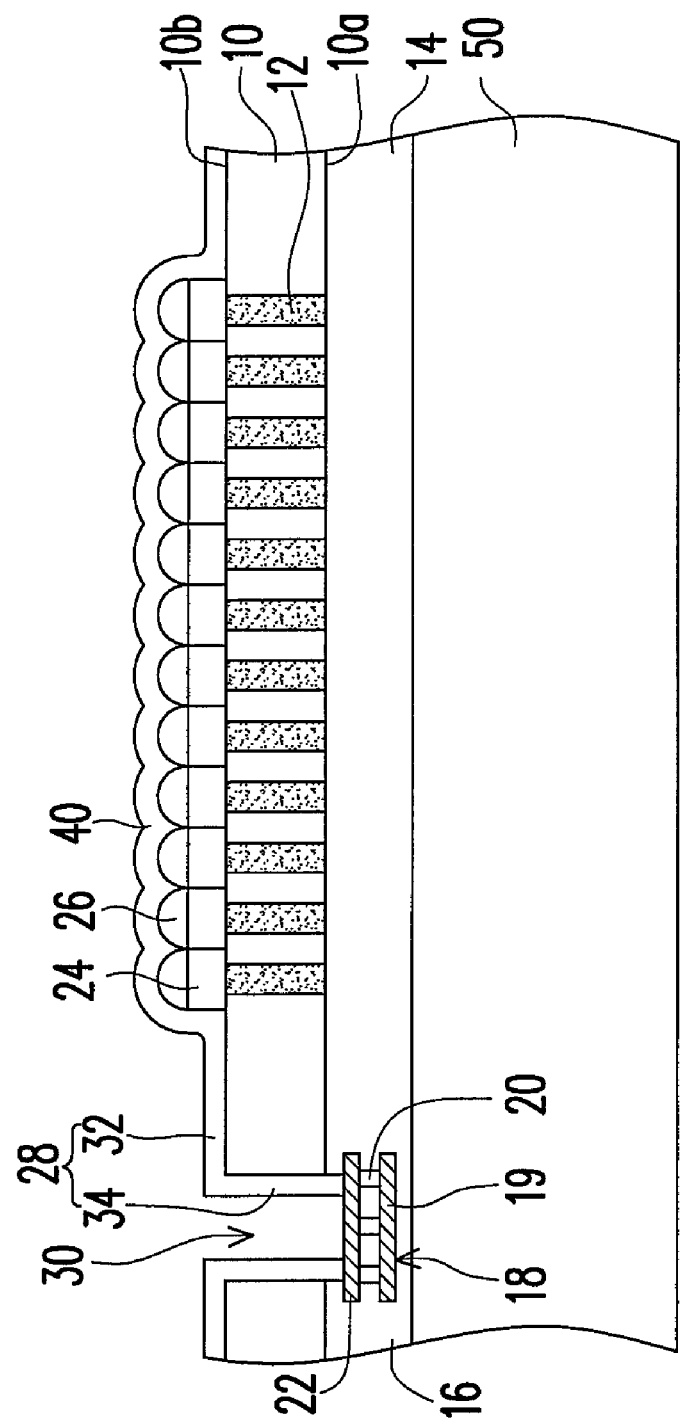

In still another embodiment, referring to FIG. 6, the protection layer 28 and the cap layer 40 include the same material. The method of forming the protection layer 28 is described below. A cap material layer is formed on the substrate 10. Thereafter, photolithography and etching processes are performed to pattern the cap material layer, so as to remove the cap material layer on the bottom of the pad opening 30 to expose the pad 22. Accordingly, the remaining cap material layer can serve as the cap layer 40 and the protection layer 28.

Figure 7:
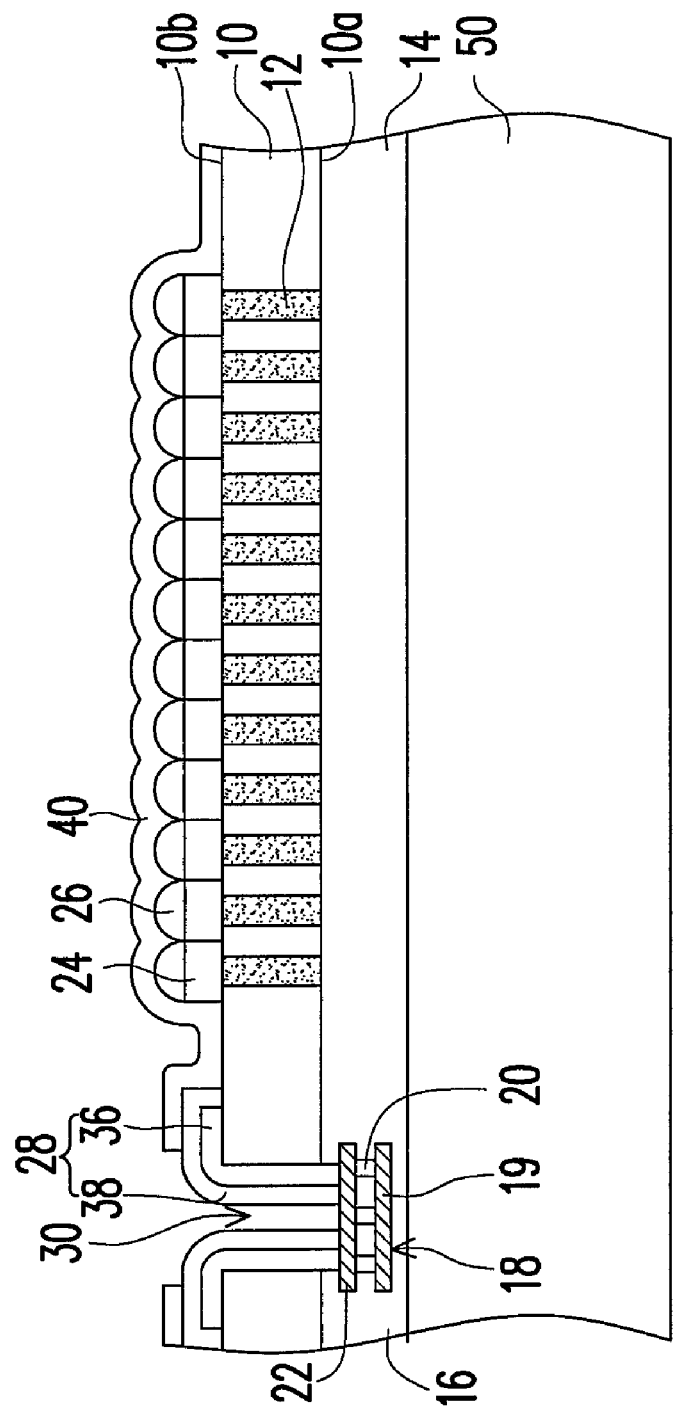

In some embodiment, referring to FIG. 7, the protection layer 28 is a stacked structure of two different materials, a first material layer 36 covers the top corner and the sidewall of the pad opening 30 and substrate 10 approximate to the top corner of the pad opening 30, and a second material layer 38 covers the first material layer 36. The material of the first material layer 36/the second material layer 38 can be the same as that of the above-mentioned inorganic dielectric material layer/ the anti-reflection layer 42, the above-mentioned inorganic dielectric material layer/the color filter array 24, the above-mentioned inorganic dielectric material layer/the micro-lenses 26, the anti-reflection layer 42/the color filter array 24, the anti-reflection layer 42/the micro-lenses 26, or the color filter array 24/the micro-lenses 26.

Figure 8:
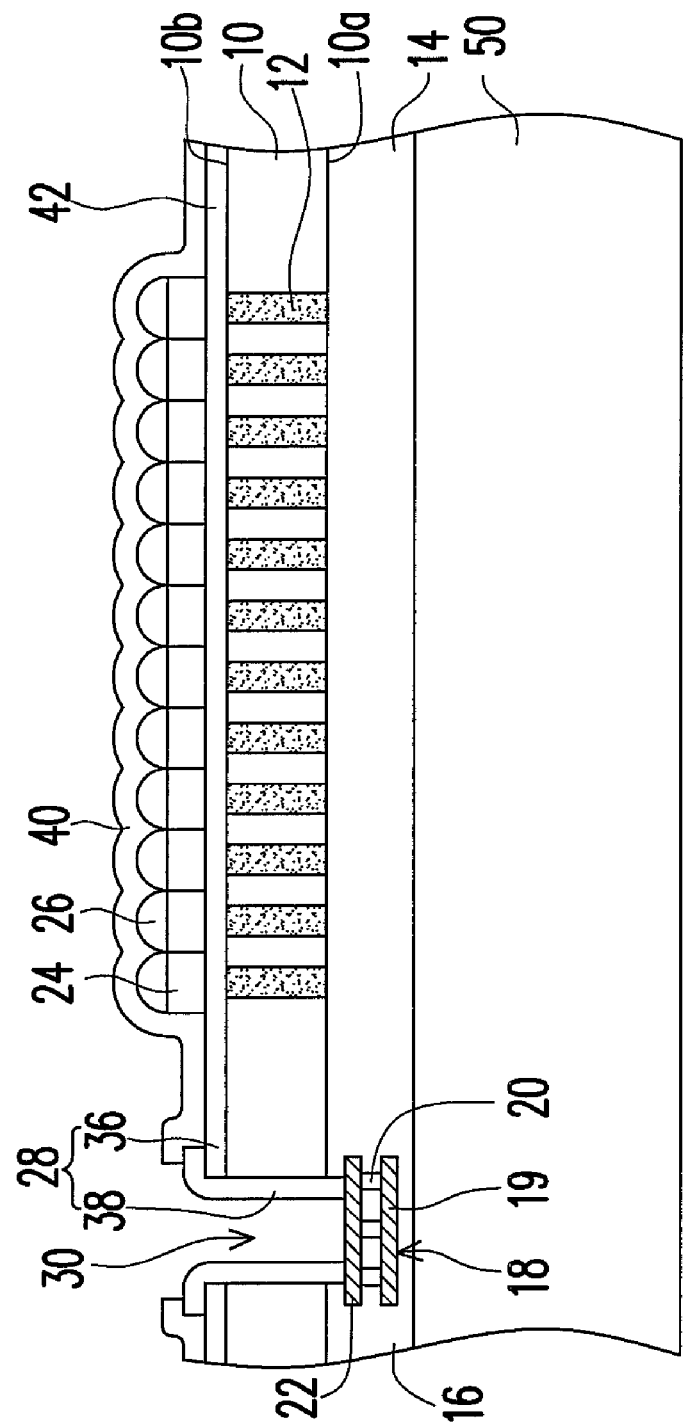

In some embodiment, referring to FIG. 8, the protection layer 28 is a stacked structure of two different materials, a first material layer 36 is disposed on the substrate 10 approximate to the top corner of the pad opening 30 and extends between the substrate 10 and the color filter array 24, and a second material layer 38 covers a portion of the first material layer 36 and the sidewall of the pad opening 30. The material of the first material layer 36/the second material layer 38 can be the same as that of the above-mentioned inorganic dielectric material layer/the anti-reflection layer 42, the above-mentioned inorganic dielectric material layer/the color filter array 24, the above-mentioned inorganic dielectric material layer/ the micro-lenses 26, the anti-reflection layer 42/the color filter array 24 or the anti-reflection layer 42/the micro-lenses 26.

Figure 9:
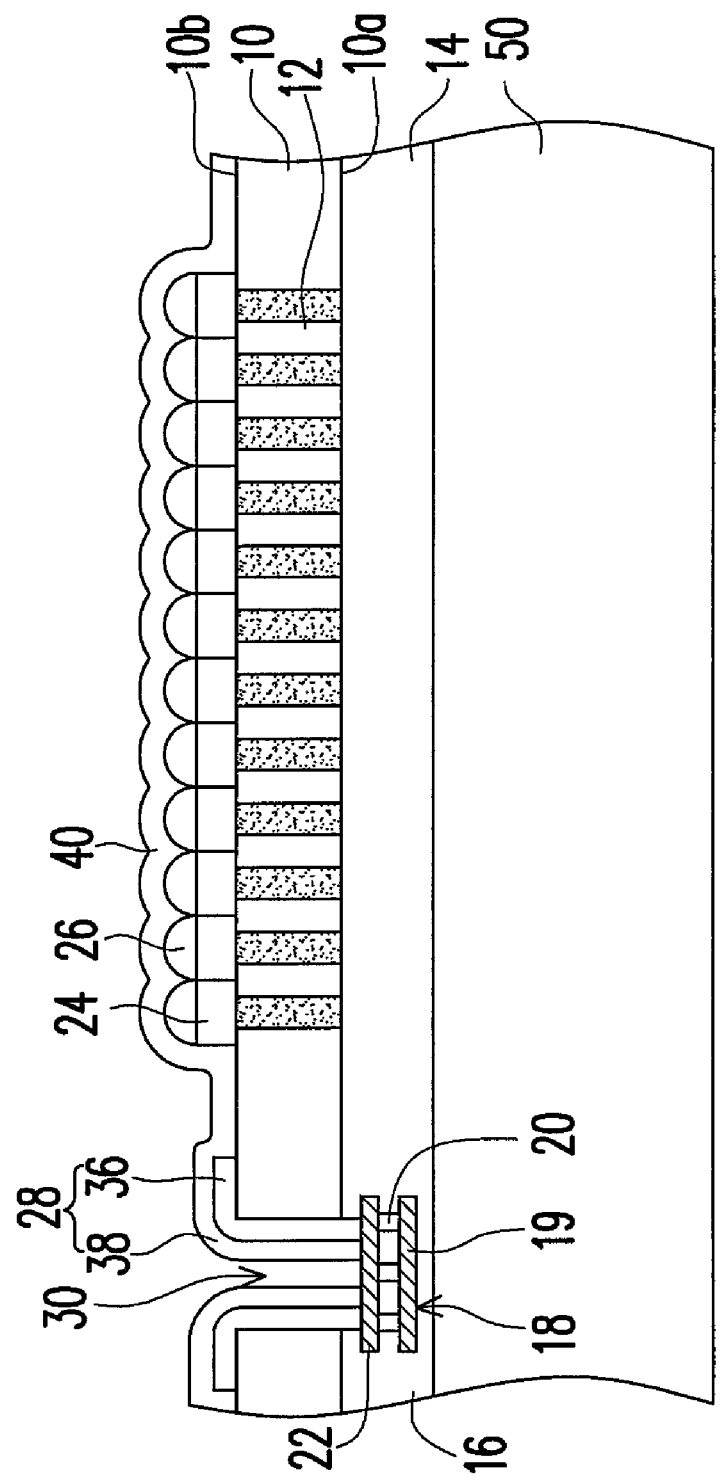
Figure 10:
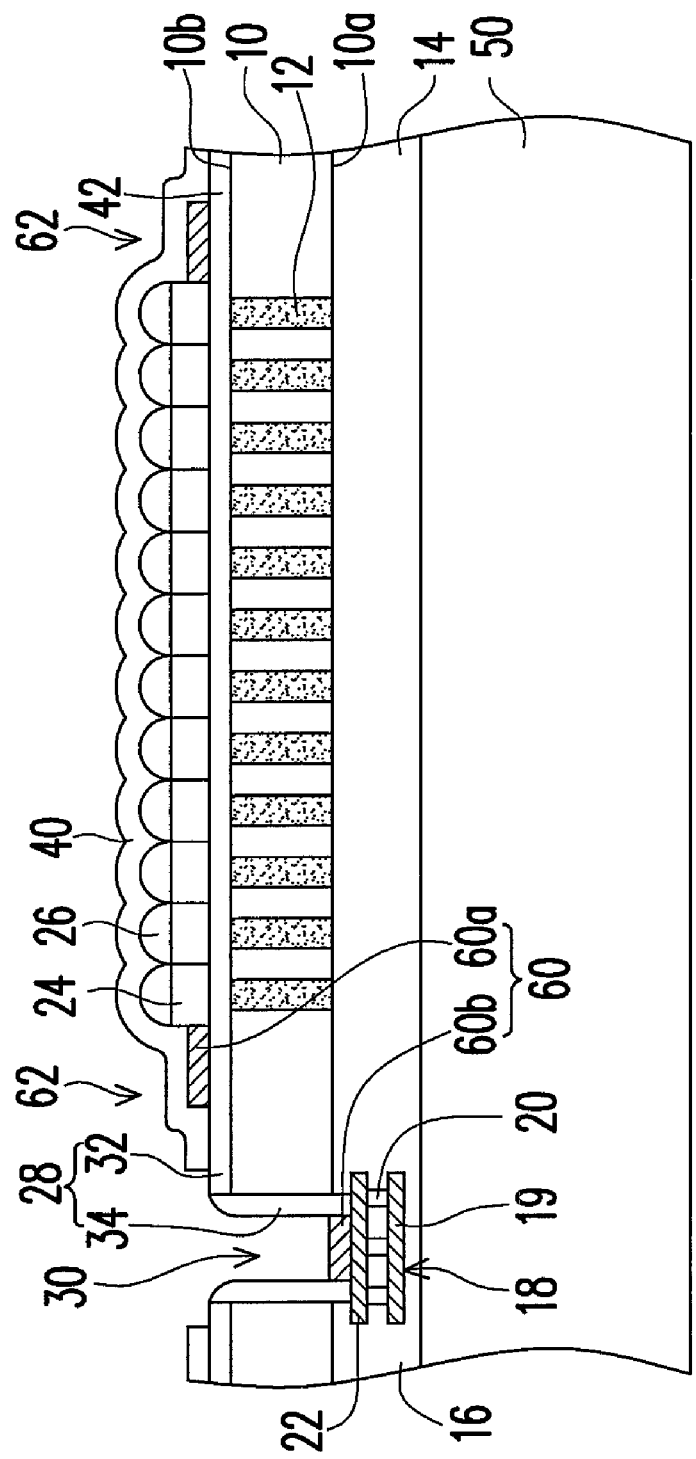
FIGS. 10 to 11 each schematically illustrate a cross-sectional view of a backside illuminated (BSI) image sensor with a thicker pad according to an embodiment of the present invention.
Figure 11:
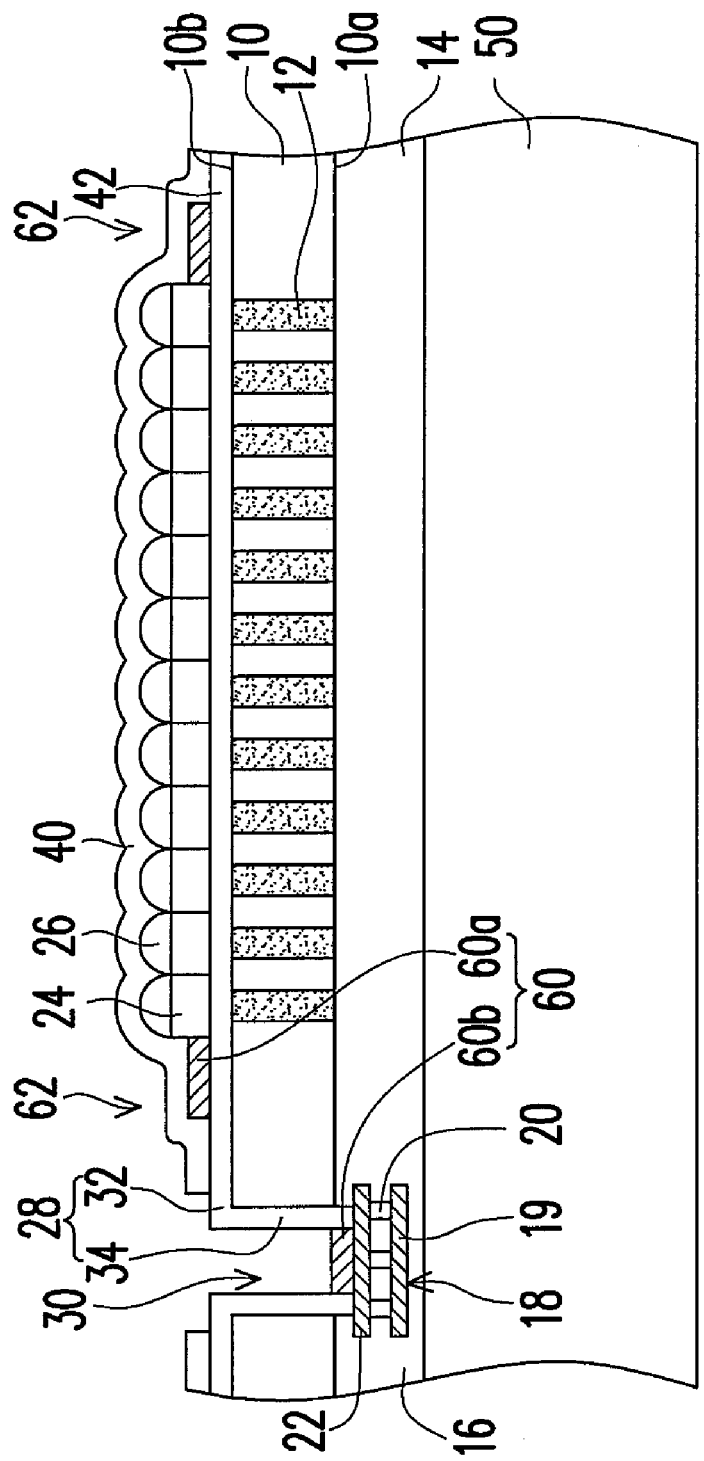

In some embodiment, referring to FIG. 9, the protection layer 28 is a stacked structure of two different materials, a first material layer 36 covers the top corner and the sidewall of the pad opening 30 and substrate 10 approximate to the top corner of the pad opening 30, and a second material layer 38 covers the first material layer 36. The second material layer 38 is connected to the cap layer 40. The material of the first material layer 36/the second material layer 38 can be the same as that of the above-mentioned inorganic dielectric material layer/the cap layer 40, the anti-reflection layer 42/the cap layer 40, the color filter array 24/the cap layer 40 or the micro-lenses 26/the cap layer 40.

Some of the above-mentioned embodiments in which the protection layer is a double-layer stacked structure are provided for illustration purposes and are not construed as limiting the present invention. The protection layer can be a multi-layer stacked structure upon the process requirements.

In summary, in the present invention, the protection layer is formed to protect the top corner and the sidewall of the pad opening, so as to avoid electrical short caused by the probing pin, bond wire or bond ball contacting the substrate around the pad opening during the testing and packaging processes. In the above-mentioned embodiments of the present invention, the method of forming the protection layer can be easily integrated with the process of forming the BSI image sensor, and only simple steps are required to complete the protection layer.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A backside illuminated (BSI) image sensor, comprising:
    a substrate, having a first surface and a second surface, wherein the substrate has a pad opening therein through the first surface and the second surface;
    a plurality of photosensitive regions, disposed in the substrate;
    a back-end-of-line (BEOL), disposed on the first surface of the substrate;
    a pad, disposed in the BEOL and exposed by the pad opening;
    a color filter array, disposed on the second surface of the substrate;
    a plurality of micro-lenses, disposed on the color filter array; and
    a protection layer, at least covering a top corner and a sidewall of the pad opening and further extending between the substrate and the color filter array.

2. The BSI image sensor of claim 1, the protection layer comprises an inorganic dielectric material, an organic material or a combination thereof.

3. The BSI image sensor of claim 2, wherein the inorganic dielectric material comprises silicon oxide, silicon nitride, silicon oxynitride or a combination thereof.

4. The BSI image sensor of claim 2, wherein the organic material comprises a positive photoresist material or a negative photoresist material.

5. The BSI image sensor of claim 1, further comprising an anti-reflection layer disposed between the substrate and the color filter array, wherein the protection layer and the anti-reflection layer comprise the same material.

6. The BSI image sensor of claim 1, wherein the protection layer and the color filter array comprise the same material.

7. The BSI image sensor of claim 1, wherein the protection layer and the micro-lenses comprise the same material.

8. The BSI image sensor of claim 1, further comprising a cap layer covering the micro-lenses, wherein the protection layer and the cap layer comprise the same material.

9. The BSI image sensor of claim 1, wherein the protection layer is a single layer.

10. The BSI image sensor of claim 1, wherein the protection layer is a stacked structure.

11. The BSI image sensor of claim 10, wherein the stacked structure comprises a first material layer and a second material layer, and at least one of the first material layer and the second material layer covers the top corner and the sidewall of the pad opening.

12. The BSI image sensor of claim 11, wherein the first material layer and the second material layer comprise different materials.

13. The BSI image sensor of claim 11, wherein a material of the first material layer is the same as a material of an inorganic dielectric material layer, an anti-reflection layer, the color filter array or the micro-lenses.

14. The BSI image sensor of claim 11, wherein a material of the second material layer is the same as a material of an inorganic dielectric material layer, an anti-reflection layer, the color filter array, the micro-lenses or a cap layer.

15. The BSI image sensor of claim 1, wherein the protection layer comprises a first portion and a second portion, the first portion is disposed on the second surface of the substrate, and the second portion is disposed on the sidewall of the pad opening and connected to the first portion.

16. The BSI image sensor of claim 15, wherein the first portion and the second portion comprise the same material.

17. The BSI image sensor of claim 15, wherein the first portion and the second portion comprise different materials.

18. The BSI image sensor of claim 1, further comprising a metal shield to cover the pad and the protection layer on an optical black area.

19. The BSI image sensor of claim 1, further comprising a handle wafer disposed on the first surface of the substrate, wherein the BEOL is disposed between the handle wafer and the substrate.

* * * * *